United States Patent [19]

Dwarakanath

[11] 4,404,544
[45] Sep. 13, 1983

[54] μ-LAW/A-LAW PCM CODEC

[75] Inventor: Mirmira R. Dwarakanath, Berkeley Heights, N.J.

[73] Assignee: Bell Telephone Laboratories, Incorporated, Murray Hill, N.J.

[21] Appl. No.: 252,600

[22] Filed: Apr. 9, 1981

[51] Int. Cl.³ .................. H03K 13/02; H03K 13/08
[52] U.S. Cl. ...................... 340/347 AD; 340/347 C; 340/347 DA; 340/347 M
[58] Field of Search ....... 340/347 M, 347 C, 347 AD, 340/347 DA; 375/30, 25; 370/7

[56] References Cited

U.S. PATENT DOCUMENTS

| | | | |
|---|---|---|---|
| 3,594,782 | 7/1971 | Carbrey | 340/347 DA |
| 3,626,408 | 12/1971 | Carbrey | 340/347 AD |
| 3,651,518 | 3/1972 | Carbrey | 340/347 AD |
| 3,653,030 | 3/1972 | Carbrey | 340/347 AD |
| 3,653,035 | 3/1972 | Carbrey | 340/347 C |
| 3,745,555 | 7/1973 | Carbrey | 340/347 AD |
| 4,231,022 | 10/1980 | Kosugi et al. | 340/347 DA |

OTHER PUBLICATIONS

Members of the Technical Staff, Bell Telephone Labs, Transmission Systems for Communication, 1971, pp. 574-583.

Tsividis et al., A Segmented U-255 Law PCM Voice Encoder—, IEEE Journal of Solid-State Circuits, vol. SC-11, No. 6, pp. 740-747.

Dwarakanath et al., A Two-Chip CMOS CODEC, International Conference on Communications, 1980 Conference Record, pp. 11.3.1-11.3.4.

Primary Examiner—T. J. Sloyan
Attorney, Agent, or Firm—Lucian C. Canpea

[57] ABSTRACT

In a PCM CODEC, a binary-weighted charge redistribution capacitor array is designed to be configured for either μ-law or A-law coding. Selection of one or the other coding configuration is achieved by controlling a single gate circuit. A unique cascaded switch arrangement ensures that when selected capacitors representative of a specified coding segment are connected to a reference voltage source, the next successive capacitor of the array is automatically connected to a variable source that provides a voltage representative of a step within the specified segment.

9 Claims, 7 Drawing Figures

| | HIGH CONTROL SIGNAL ("1") | LOW CONTROL SIGNAL ("0") |
|---|---|---|
| N TRANSISTOR | ON | OFF |
| P TRANSISTOR | OFF | ON |

FIG. 6

μ-LAW/A-LAW PCM CODEC

BACKGROUND OF THE INVENTION

This invention relates to a pulse-code-modulation (PCM) system and, more particularly, to a coder-decoder (CODEC) for inclusion in such a system.

To optimize the signal-to-noise ratio of a PCM system designed for voice transmission, it is known to employ nonlinear coding formats of the μ-law or A-law type for analog-to-digital and digital-to-analog conversion. (For a description of these formats, see, for example, *Transmission Systems for Communications*, by Members of the Technical Staff, Bell Telephone Laboratories, revised fourth edition, published by Western Electric Co., 1971, pages 574–583.) The μ-law format (more specifically, the segmented μ-255 companding law) is typically specified for transmission systems intended for use in the U.S.A. whereas the A-law format is typically specified for European transmission systems.

Moreover, it is known that the charge redistribution principle (described, for example, by R. L. Carbrey in U.S. Pat. Nos. 3,594,782, 3,626,408, 3,651,518, 3,653,030, 3,653,035 and 3,745,555) can be implemented with binary-weighted capacitor arrays to realize companded analog-to-digital and digital-to-analog conversion functions. The application of these principles to companded conversion and the realization thereof in integrated circuit form are described in an article entitled "A Segmented μ-255 Law PCM Voice Encoder Utilizing NMOS Technology", by Y. P. Tsividis et al., IEEE *Journal of Solid-State Circuits*, volume SC-11, No. 6, December 1976, pp. 740–747.

In a conventional μ-law charge redistribution CODEC of the type described in the aforecited Tsividis et al article, a binary-weighted capacitor array is employed to generate the so-called chord or segment boundaries and a second capacitor array, or a resistor divider, is utilized to generate the steps within a segment. (Such arrays for μ-law coding are also described in "A Two-Chip CMOS CODEC" by M. R. Dwarakanath and D. G. Marsh, *International Conference on Communications—1980 Conference Record*, Seattle, Washington, June 8–12, 1980, pp. 11.3.1–11.3.4.)

For A-law coding, a differently configured binary-weighted capacitor array is required. But, in the course of work aimed at trying to integrate a μ-law/A-law PCM CODEC and associated filters on a single small-area chip, it was recognized by workers in the field that it is not advantageous to include two distinct arrays on the chip for μ-law and A-law coding, respectively.

Accordingly, efforts have been directed by CODEC designers at attempting to provide a general purpose binary-weighted capacitor array that could be easily and simply controlled to achieve either μ-law or A-law coding. Moreover, in connection with efforts to implement such a CODEC in a small-area single chip, efforts have also been directed at trying to simplify the manner in which specified capacitors of the array are selectively connected to associated reference voltage sources. It was recognized that such efforts, if successful, would constitute an important contribution to the realization of a small-area single-chip PCM CODEC with filters.

SUMMARY OF THE INVENTION

Hence, an object of the present invention is an improved PCM CODEC. More specifically, an object of this invention is a relatively simple circuit arrangement including a binary-weighted capacitor array capable of being easily configured to implement either μ-law or A-law coding.

Briefly, these and other objects of the present invention are realized in a specific illustrative embodiment thereof in which a single binary-weighted capacitor array is capable of being configured to generate segment boundaries in accordance with either a μ-law or an A-law coding format. Selection of one or the other coding configuration is achieved, for example, by controlling the state of a single gate circuit. Moreover, a cascaded switch arrangement connected to the capacitor array ensures that when selected capacitors representative of a specified coding segment are connected to a reference voltage source, the next successive higher-valued capacitor of the array is automatically connected to a variable reference source that supplies a voltage representative of a particular step within the specified segment.

BRIEF DESCRIPTION OF THE DRAWING

A complete understanding of the present invention and of the above and other features thereof may be gained from a consideration of the following detailed description presented hereinbelow in connection with the accompanying drawing, in which.

DETAILED DESCRIPTION

Figure 1:
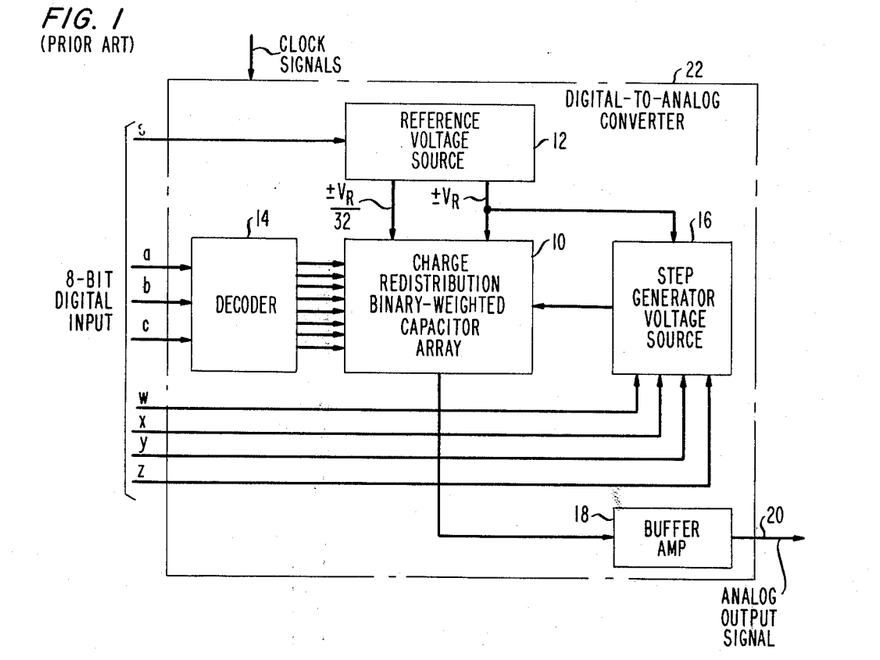
FIG. 1 is a block diagram representation of a conventional digital-to-analog converter that includes a standard charge redistribution binary-weighted capacitor array as an integral part thereof.
Figure 2:
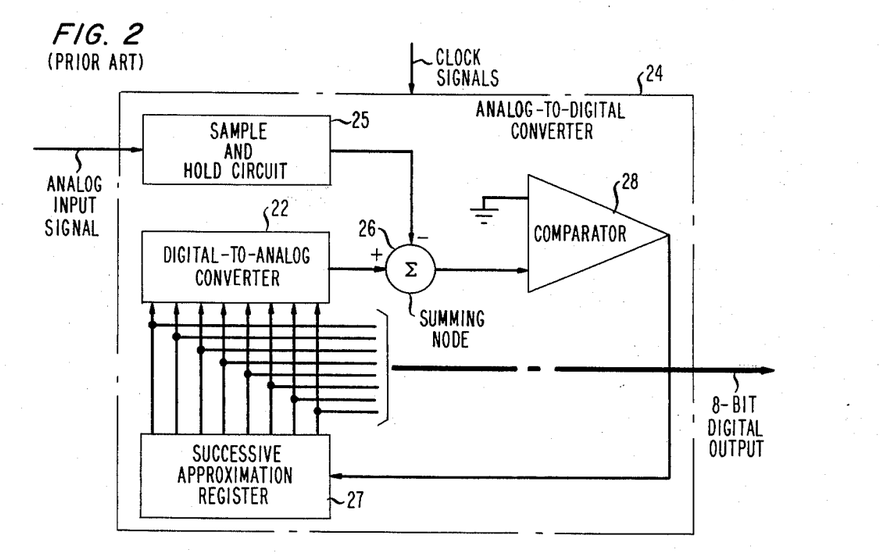
FIG. 2 is a block diagram representation of a conventional analog-to-digital converter that also includes a standard charge redistribution binary-weighted capacitor array.

FIG. 1 is a generalized block diagram representation of a known arrangement for converting a digital input word to a corresponding analog output signal. FIG. 2, which includes the FIG. 1 representation as a component part thereof, is a known arrangement for converting an analog input signal to a digital output word. It will be assumed herein that both encoding and decoding are to be done in accordance with the aforespecified μ-255 companding format or the A-law format, both of which are well known. In either coding format, the transfer characteristic curve is typically represented by a multisegmented approximation that includes 8 segments for each polarity. Each segment (except the first one in the μ-law format) consists of 16 equal steps. (The first μ-law segment comprises 15½ steps.) The step size within a given segment is constant, but doubles as one goes from one segment to the next (except for A-law coding, wherein the first two segments are colinear and the step size therein remains the same), starting from the segment adjacent to the origin and going towards higher amplitudes. The two steps adjacent to and symmetrical about the origin are merged into a single step, with the origin of the transfer curve as its middle point. There are accordingly a total of 255 steps in each characteristic.

Since there are a total of 255 possible intervals in each of the aforespecified characteristics, the μ-law and A-law coding to be considered herein involves 8-bit words. ($2^8=256$.) Encoding involves converting an analog input signal to an 8-bit output word, whereas decoding involves converting an 8-bit input word to an analog output signal. For purposes of a specific illustrative example, it will be assumed throughout herein that the successive binary digits of each 8-bit word are designated sabcwxyz. The first bit(s) indicates the sign of the word. The next three bits (abc) indicate a particular segment of the characteristic curve. The last four bits (wxyz) designate a particular step within the indicated segment. As will be specified in detail later below, the bits abc are employed to designate one of eight n values, and the bits wxyz are utilized to specify one of 16 m values.

It is known that the principle of charge redistribution utilizing a binary-weighted capacitor array can be employed to generate voltages representative of so-called decision levels corresponding to the end points of the aforespecified segments of the transfer characteristic for μ-law or A-law coding. Such an array 10 is shown in FIG. 1.

Moreover, it is known that the array 10 of FIG. 1 can be employed to develop voltages corresponding to the end points of each of the 16 equal steps of any specified segment. This is done by switching each capacitor in the array either to a reference voltage ($\pm V_R$) or to a specified multiple $$\left(\frac{m}{16}\right)$$

of the reference voltage (where m is determined by the bits wxyz of the input word to be decoded).

In FIG. 1, $\pm V_R$ (as well as $\pm V_R/32$) is supplied to the array 10 by a reference voltage source 12. Whether the voltage so supplied is positive or negative depends, respectively, on the binary value of the input s bit. Further, the bits abc of the input word are decoded in unit 14 and applied to the array 10 to determine which of the capacitors therein are to be connected to the positive or negative output $V_R$ of the reference voltage source 12. The bits wxyz are applied to a step generator voltage source 16 which in turn applies the aforementioned multiple of the reference voltage to the array 10. In the array 10, a specified one of the capacitors is connected to the output $\pm mV_R/16$ of the source 16. In that way, the array 10 is controlled to provide an analog voltage representative of an applied 8-bit word, as is known in the art. Such a voltage is applied via a buffer amplifier 18 to an output line 20.

The digital-to-analog converter 22 shown in FIG. 1 is a constituent block of the analog-to-digital converter 24 schematically illustrated in FIG. 2. In FIG. 2, this block is designated with the same reference numeral (22). An input analog signal to be converted by the FIG. 2 arrangement is applied via a sample and hold circuit 25 to a summing node 26. At the node 26, the input signal and the analog output signal of the converter 22 are combined. (The input to the converter 22 is an 8-bit word determined by a standard successive approximation register 27.) If these signals are not equal, a positive or negative resultant signal is applied to a comparator 28. Under that condition, the comparator supplies a signal to the successive approximation register 27. The register 27 responds thereto by applying a different 8-bit word to the converter 22. As a result, the analog output of the converter 22 changes. Finally, when the analog signals applied to the node 26 are determined to be equal or approximately equal, the 8-bit output of the register 30 constitutes a digital representation of the particular analog signal that had been sampled and held by the circuit 24.

Figure 3:
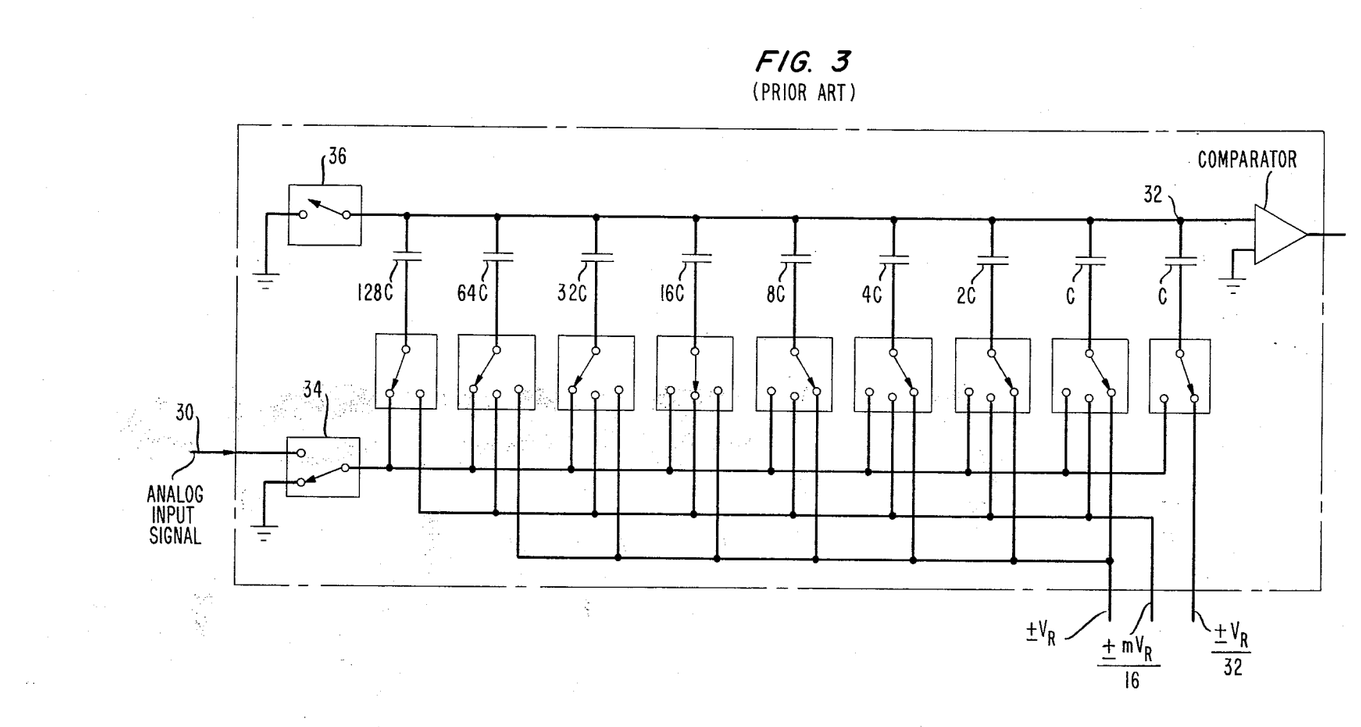
FIG. 3 shows a known charge redistribution binary-weighted capacitor array adapted to implement μ-law encoding.

A conventional binary-weighted capacitor array designed to implement μ-law encoding is shown in FIG. 3. The array comprises 9 capacitors whose relative values are C, C, 2C, 4C, 8C, 16C, 32C, 64C and 128C, where C is the capacitance of the unit capacitor with which the array is built by replication. FIG. 3 corresponds exactly to FIG. 1 of the aforecited Dwarakanth-Marsh article.

During an encoding operation, an analog signal applied to input line 30 of FIG. 3 is sampled on the entire capacitor array and held at a common node point 32 with a sign reversal. This is done by moving switch 34 to its grounded position at the same time that switch 36 is opened, as is well known. In this way, the sample and hold function is in effect embodied in the depicted array itself. The polarity of the sample-and-held signal is determined by the comparator. This determines the s bit and also selects a positive or negative reference voltage.

Subsequently, the right-most capacitor C of FIG. 3 is switched from ground to $-V_R/32$, where $V_R$ is the aforespecified reference voltage. A set of capacitors of total magnitude nC (n=0, 1, 3, 7, 15, 31, 63, 127) is switched to $V_R$ and the single capacitor of magnitude (n+1) C is switched to $mV_R/16$ (m=0, 1, 2, 3, 4, 5, 6, 7, 8, 9, 10, 11, 12, 13, 14, 15) in a standard successive approximation manner until the voltage at the common node point 32 approaches zero within a specified granularity. A so-called decision level (DL) is a value of the analog input voltage $V_{in}$ for which the voltage $V_x$ at the node point 32 is precisely zero at the end of conversion.

In view of the above, the voltage $V_x$ at the common node point 32 of FIG. 3 can be expressed as follows:

$$V_x = -V_{in} + \frac{C}{256C}\left[-\frac{V_R}{32}\right] + \frac{nC}{256C}[V_R] + \frac{(n+1)C}{256C}\left[\frac{mV_R}{16}\right]. \quad (1)$$

And, since the decision levels are values of $V_{in}$ for which $V_x=0$, DL is as follows:

$$DL = V_R/8192\ [32n + 2m(n+1) - 1]. \quad (2)$$

As so determined, these decision levels are in fact those definitive of the standard μ-255 companding law embodied in a conventional analog-to-digital converter.

The capacitor array shown in FIG. 3 can also be employed for digital-to-analog decoding in accordance with the aforespecified μ-law format. In that case, the common node point 32 is initially and momentarily connected to ground via the switch 36. The bottom plates of all the capacitors in the array are connected to ground via the switch 34. An 8-bit input digital word is decoded by switching the right-most capacitor to $-(V_R/32)$, nC to $V_R$ and $(n+1)C$ to $(mV_R/16)$, as in the previously described encoding operation. The actual numerical values of n and m are determined by the abc and wxyz portions, respectively, of each input word. As before, the eight possible abc representations respectively designate n values of 0, 1, 3, 7, 15, 31, 63 and 127. But, for decoding, the 16 possible wxyz representations respectively designate m values of 0.5, 1.5, 2.5, 3.5, 4.5, 5.5, 6.5, 7.5, 8.5, 9.5, 10.5, 11.5, 12.5, 13.5, 14.5 and 15.5. The so-called reconstruction levels (RL) for μ-law decoding are defined as follows, where m and n are as specified immediately above:

$$RL = (V_R/8192)[32n + 2(n+1)m - 1]. \quad (3)$$

For A-law encoding and decoding as heretofore practiced, another differently configured capacitor array is typically employed. The standard A-law capacitor array is similar to the array shown in FIG. 3. But the A-law array includes only 8 capacitors whose relative values are C, C, 2C, 4C, 8C, 16C, 32C and 64C. And for A-law coding, the voltage source $(\pm V_R/32)$ is not required. Each capacitor of the array is connected either to $\pm V_R$, to $(\pm mV_R/16)$ or to ground.

For coding utilizing the standard array shown in FIG. 3, a number of three-position switches are required. As implemented in digital circuitry in integrated circuit form, each of these switches requires two control signals. Moreover, for both μ-law and A-law coding, relatively complicated logic circuitry associated with the capacitor array is required to determine which of the capacitors is to be switched to $(\pm mV_R/16)$.

Figure 4:
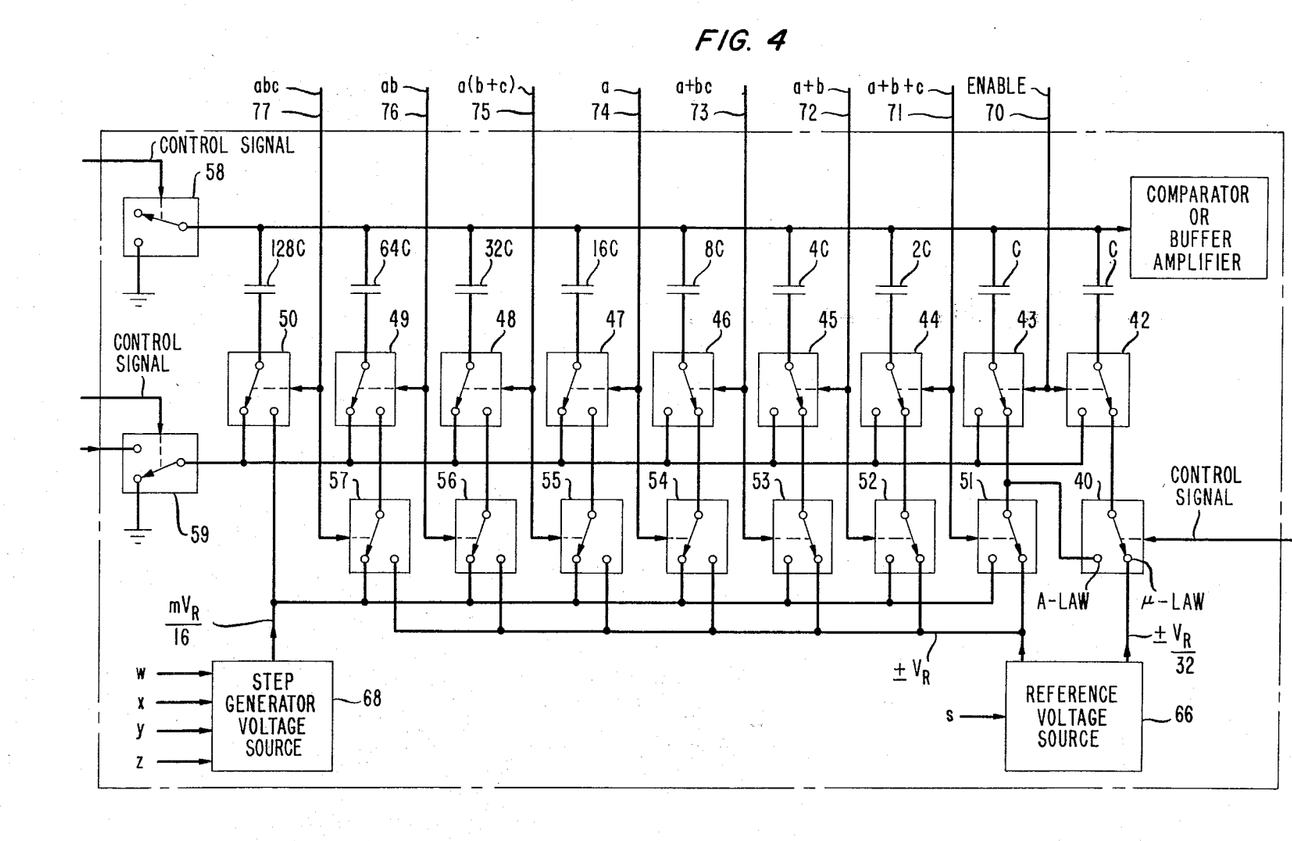
FIG. 4 depicts a general purpose charge redistribution binary-weighted capacitor array made in accordance with the principles of the present invention.

In accordance with the principles of the present invention, a single general purpose capacitor array, shown in FIG. 4, is employed for both μ-law and A-law coding. The array is configured for one or the other coding format simply by controlling the condition of a single-pole double-throw switch 40. During manufacture, the structure of the switch 40 can be fabricated to be permanently hard wired in either the μ-law or A-law position. In that case, the PCM CODEC that includes the depicted array is permanently dedicated to one of the two specified coding formats. Alternatively, the depicted array included in a PCM CODEC can be manufactured to be a general purpose unit adaptable for either μ-law or A-law coding. In the latter case, a single bit applied to the CODEC is utilized to control the condition of the switch 40. In that way, the depicted array can be easily switched from one coding format to the other.

In principle, a single array of the type shown in FIG. 4 can be used for both encoding and decoding in accordance with the herein-considered μ-law or A-law format. But in practice it has been found that such dual use of the array can in some cases cause sufficient cross-talk to be objectionable. Moreover, such dual use of the array typically requires associated circuitry to enable storing partial coding results during overlapping time-sharing use of the single array. Accordingly, for some applications of practical interest, it is advantageous to use one array of the type depicted in FIG. 4 for μ-law/A-law encoding and another identical one for μ-law/A-law decoding. But, as stated above, the single depicted array is in principle suitable for both encoding and decoding in accordance with either the μ-law or A-law format.

For μ-law coding, the switch 40 is set in the position shown in FIG. 4. In that case, the bottom plate of the right-most capacitor C is connected to $(\pm V_R/32)$ and the bottom plates of the remaining capacitors of the array are either maintained at ground potential or connected to $\pm V_R$ or $(mV_R/16)$, exactly as was the case with the aforedescribed FIG. 3 array designed for μ-law coding.

The significant difference between the μ-law arrays of FIGS. 3 and 4 resides in the switch structure by means of which selected capacitors of the array are connected to the aforespecified potentials. In accordance with the principles of the present invention, and as shown in FIG. 4, a unique relatively simple cascaded arrangement of single-pole double-throw switches 42 through 57 is utilized to control connections between the array capacitors and associated voltage sources. The arrangement ensures that when selected capacitors representative of a specified coding segment are connected to a reference voltage source, the next higher-valued capacitor of the array is automatically connected (without the necessity for additional logic circuitry) to a variable reference source that supplies a voltage representative of a particular step within the specified segment.

The switch arrangement of FIG. 4 will be described in more detail later below. But first the applicability of the FIG. 4 array for A-law coding will be described.

For A-law coding, the switch 40 included in FIG. 4 is thrown to its left-hand position. In that way, and because of the ganged nature of associated switches 42 and 43, the two right-hand capacitors each designated C are always connected in parallel either to $\pm V_R$ (as shown in FIG. 4), to ground (if the switches 42 and 43 are activated to the left) or to $(\pm mV_R/16)$ (if the switches 42 and 43 remain as shown in FIG. 4 and the switch 51 is activated to the left). The two right-most capacitors so connected in parallel may in effect thus be regarded as a single capacitor having a relative value 2C.

Similarly, each of the other capacitors included in the FIG. 4 array is connectable either to $\pm V_R$, to ground or to $(\pm mV_R/16)$ by means of the depicted switches 44 through 50 and 52 through 57. As is evident, the capacitors in the array are characterized by capacitances having the relative values 2C, 2C, 4C, 8C, 16C, 32C, 64C and 128C when the switch 40 is in the A-law position. Significantly, such an array of capacitors is in fact capable of representing all the decision levels and reconstruction levels definitive of the aforespecified A-law coding format.

Thus, the general purpose capacitor array shown in FIG. 4 is adapted to perform either μ-law or A-law coding. As described above, selection of the desired coding format is implemented simply by controlling the position of a single single-pole double-throw switch (the switch 40 of FIG. 4).

Figure 5:
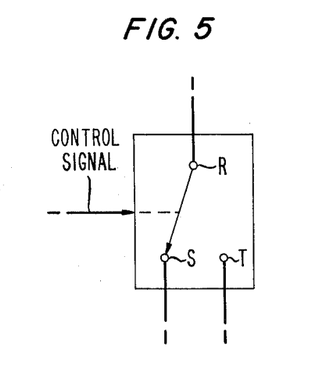
FIG. 5 is a schematic representation of the basic building block switch included in the FIG. 4 arrangement.

Each of the switches 40, 42 through 57, 58 and 59 included in the FIG. 4 array is of the form schematically depicted in FIG. 5. Quiescently, when an applied control signal is relatively low (a "0" indication), the FIG. 5 switch provides a conductive path between a common input terminal R and one of two output terminals S and T. When the control signal goes high (a "1" indication), the switch then provides a conductive path between the terminal R and the other one of the terminals S and T.

Figure 6:
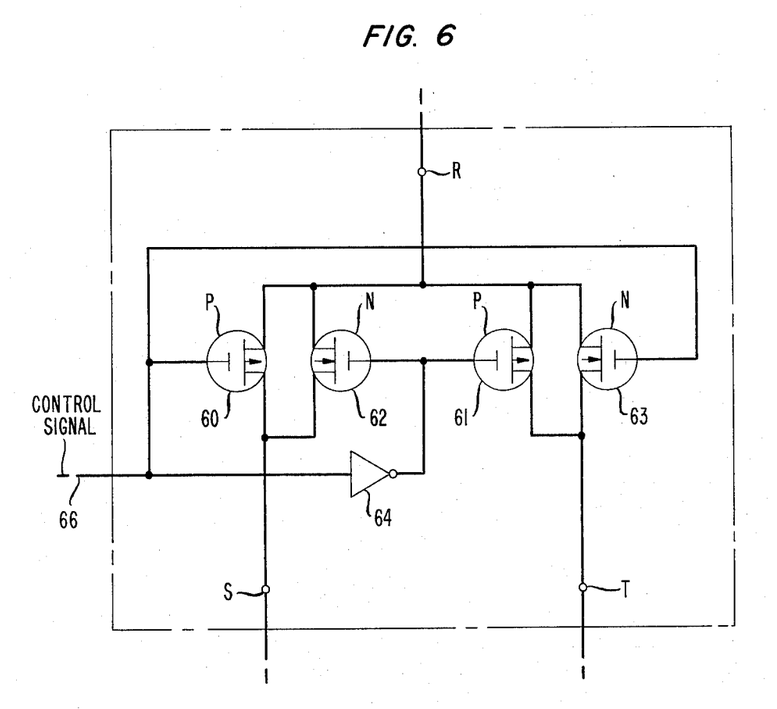
FIG. 6 schematically shows a specific illustrative circuit implementation of the FIG. 5 switch, utilizing standard N-type and P-type metal-oxide-semiconductor transistors.

A specific illustrative circuit embodiment of the FIG. 5 switch is shown in FIG. 6. The depicted circuit is a conventional one and is easily fabricated in integrated circuit form utilizing standard complementary-metal-oxidesemiconductor (CMOS) technology.

The FIG. 6 circuit includes P-type transistors 60 and 61, N-type transistors 62 and 63 and a standard inverter unit 64. In response to a "0" control signal applied to input lead 66, the P-type transistor 60 is energized (rendered conducting) whereas the N-type transistor 63 is de-energized. Moreover, the "0" input control signal is inverted by the unit 64 to a "1" signal that energizes the N-type transistor 62 and de-energizes the P-type transistor 61. Accordingly, for a "0" input control signal, the common input terminal R is in effect connected to the output terminal S via the energized transistors 60 and 62.

For a "1" control signal applied to the input lead 66 of FIG. 6, it is apparent that the transistors 60 and 62 are de-energized while the transistors 61 and 63 are energized. Hence, for that input condition, the common input terminal R is in effect connected to the output terminal T.

Figure 7:
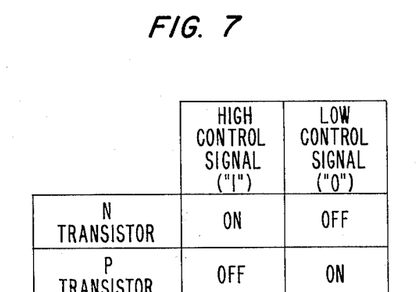
FIG. 7 is a table definitive of the operation of the FIG. 6 circuit.

FIG. 7 is a table that summarizes the manner in which the transistors 60 through 63 of FIG. 6 respond to "0" and "1" control signals. The summary corresponds to the description set forth above.

In accordance with the principles of the present invention, selected ones of the switches shown in FIG. 4 are in effect paired by having the same control signal applied thereto. As previously mentioned, the switches 42 and 43 are so paired. Additionally, the following other pairs of switches in FIG. 4 each have respective common control signals applied thereto: 44 and 51, 45 and 52, 46 and 53, 47 and 54, 48 and 55, 49 and 56, 50 and 57. During coding, each of the switches 44 through 49 of these pairs is effective to connect the bottom plate of an associated capacitor either to ground (via the switch 59) or to the common input terminal of the switches 52 through 57, respectively. In turn, the switches 52 through 57 enable a connection to be made either to $\pm V_R$ (one of the outputs of reference voltage source 66) or to $\pm mV_R/16$ (the output of step generator voltage source 68). Further, the switches 43 and 51 enable the second-from-the-right capacitor C to be connected to ground, to $\pm V_R$ or to $(\pm mV_R/16)$. Also, the switch 50 enables the left-most capacitor 128C to be connected either to ground or to $(\pm mV_R/16)$.

The aforespecified switching capability associated with the capacitor array shown in FIG. 4 permits $\mu$-law coding to be carried out when the switch 40 is activated to the right. Control signals applied to lines 70 through 77 are effective to systematically control the positions of the switches 42 through 57 of FIG. 4. When all the control signals are "0", the schematically represented movable arms of the switches 42 through 57 are all positioned to the left. (A switch arm is moved to the right in response to a "1" control signal.)

Whether the control signals respectively applied to the lines 71 through 77 of FIG. 4 are "0" or "1" depends on the 3-bit portion abc of the aforespecified 8-bit word applied to the depicted coding array. In FIG. 4, standard Boolean notations indicate which of the lines 71 through 77 are supplied "1" signals for any specified 3-bit portion. (To initiate coding, a "1" or Enable signal is applied to the lead 70.) Thus, for example, if the abc portion of the 8-bit word has the value 011, each of the lines 70 through 73 has a "1" signal applied thereto. (Such a value is representative of the endpoint of a particular coding segment, as previously specified.) As a result, the switch pairs 42 and 43, 44 and 51, 45 and 52, and 46 and 53 are activated (switch arms moved to the right), as indicated in FIG. 4.

Accordingly, for $\mu$-law coding, an abc portion having the value 011 results in the second-from-the-right capacitor C and the capacitors 2C and 4C each being connected to the $\pm V_R$ output of the reference voltage source 66. Thus, a total of 7C is connected to $\pm V_R$. Moreover, the next higher-valued capacitor 8C is thereby automatically connected via the switches 46 and 54 to the $(\pm mV_R/16)$ output of the step generator voltage source 68. During coding, the other capacitors 16C, 32C, 64C and 128C of the array remain connected to ground. (The right-most capacitor C is connected to $(\pm V_R/32)$ via the switch 40.)

For A-law coding (switch 40 activated to the left), an abc portion having the value 011 results in the capacitors C, C, 2C and 4C each being connected to the $\pm V_R$ output of the source 66. Thus, a total of 8C is connected to $\pm V_R$. Moreover, the next higher-valued capacitor 8C is thereby automatically connected to the $(\pm mV_R/16)$ output of the source 68. The other capacitors of the array remain connected to ground.

For any other specified abc value applied to the FIG. 4 array, a prescribed consecutive set of capacitors is connected to $\pm V_R$ and a next higher-valued capacitor is automatically connected to $(\pm mV_R/16)$, in the particular manner described above. This pattern of connections stems from the unique cascaded design of the depicted switches. No additional logic circuitry is needed to effect the desired connection pattern. And, moreover, control of the switches in the array is accomplished with only one control signal per pair of switches. These significant advantages constitute the basis for a relatively simple low-cost coding array.

Finally, it is to be understood that the above-described arrangements are only illustrative of the principles of the present invention. In accordance with these principles, numerous modifications and alternatives may be devised by those skilled in the art without departing from the spirit and scope of the invention.

What is claimed is:

1. In a PCM CODEC, a capacitor array designed to be configured for either $\mu$-law or A-law coding, said array comprising a binary-weighted set of capacitors, an additional capacitor having the same value as the lowest-valued capacitor in said set, means connecting one plate of each of said capacitors to a common node point, first means for connecting the other plate of said additional capacitor either to a fixed fraction of the opposite polarity of a reference voltage thereby to configure said array of capacitors for $\mu$-law coding or for connecting said additional capacitor and the lowest-valued capacitor in said set in parallel thereby to configure said array of capacitors for A-law coding, second means for connecting the other plate of the highest-valued capacitor in said set either to a point of reference potential such as ground or to a variable fraction of said reference voltage, and third means for connecting the other plate of each of said capacitors in said set except the lowest-valued and highest-valued capacitors thereof to said point of reference potential, to a variable fraction of said reference voltage or to said reference voltage, wherein said first, second and third means constitute a cascaded arrangement of switches for connecting the other plate of each of the capacitors in a consecutive subset of said set of capacitors to said reference voltage and at the same time automatically connecting the other plate of the next higher-valued capacitor of said set to a variable fraction of said reference voltage.

2. In a PCM CODEC, a capacitor array designed to be configured for $\mu$-law coding, said array comprising
a binary-weighted set of capacitors having the relative values C, 2C, 4C, 8C, 16C, 32C, 64C and 128C,
an additional capacitor having the relative value C,
means connecting one plate of each of said capacitors to a common node point,
first switch means for connecting the other plate of said additional capacitor either to a point of reference potential such as ground or to a fixed fraction of a reference voltage,
second switch means for connecting the other plate of said 128C-valued capacitor either to said point of reference potential or to a variable fraction of said reference voltage supplied by a step generator voltage source,
third through ninth switch means for respectively connecting the other plates of said C-, 2C-, 4C-, 8C-, 16C-, 32C- and 64C-valued capacitors either to said point of reference potential or to a respective associated one of tenth through sixteenth switch means each of which is adapted to establish a connection either to said variable fraction of said reference voltage or to a fixed reference voltage supplied by a reference voltage source,
and means for supplying eight distinct control signals to said second through sixteenth switch means in accordance with the following pattern: first control signal to third switch means, second control signal to fourth and tenth switch means, third control signal to fifth and eleventh switch means, fourth control signal to sixth and twelfth switch means, fifth control signal to seventh and thirteenth switch means, sixth control signal to eighth and fourteenth switch means, seventh control signal to ninth and fifteenth switch means, and eighth control signal to second and sixteenth switch means.

3. In a PCM CODEC, a capacitor array designed to be configured for A-law coding, said array comprising
a set of capacitors having the relative values 2C, 2C, 4C, 8C, 16C, 32C, 64C and 128C,
means connecting one plate of each of said capacitors to a common node point,
first switch means for connecting the other plate of said 128C-valued capacitor either to said point of reference potential or to a variable fraction of said reference voltage supplied by a step generator voltage source,
second through eighth switch means for respectively connecting the other plates of said 2C-, 2C-, 4C-, 8C-, 16C-, 32C- and 64C-valued capacitors either to said point of reference potential or to a respective associated one of ninth through fifteenth switch means each of which is adapted to establish a connection either to said variable fraction of said reference voltage or to a fixed reference voltage supplied by a reference voltage source,
and means for supplying eight distinct control signals to said first through fifteenth switch means in accordance with the following pattern: first control signal to second switch means, second control signal to third and ninth switch means, third control signal to fourth and tenth switch means, fourth control signal to fifth and eleventh switch means, fifth control signal to sixth and twelfth switch means, sixth control signal to seventh and thirteenth switch means, seventh control signal to eighth and fourteenth switch means, and eighth control signal to first and fifteenth switch means.

4. In a PCM CODEC, a capacitor array designed to be configured for either $\mu$-law or A-law coding, said array comprising
a binary-weighted set of capacitors having the relative values C, 2C, 4C, 8C, 16C, 32C, 64C and 128C,
an additional capacitor having the relative value C,
means connecting one plate of each of said capacitors to a common node point,
first means for connecting the other plate of said additional capacitor either to a fixed fraction of the opposite polarity of a reference voltage thereby to configure said array of capacitors for $\mu$-law coding or for connecting said two C-valued capacitors in parallel thereby to configure said array of capacitors for A-law coding,
second means for connecting the other plate of said 128C-valued capacitor either to a point of reference potential such as ground or to a variable fraction of said reference voltage,
and third means for connecting the other plate of each of said capacitors having the relative values 2C, 4C, 8C, 16C, 32C and 64C to said point of reference potential, to a variable fraction of said reference voltage or to said reference voltage,
wherein said first, second and third means constitute a cascaded arrangement of switches for connecting the other plate of each of the capacitors in a consecutive subset of said set of capacitors to said reference voltage and at the same time automatically connecting the other plate of the next higher-valued capacitor of said set to a variable fraction of said reference voltage.

5. In a PCM CODEC, a capacitor array designed to be configured for either $\mu$-law or A-law coding, said array comprising
a binary-weighted set of capacitors having the relative values C, 2C, 4C, 8C, 16C, 32C, 64C and 128C,
an additional capacitor having the relative value C,
means connecting one plate of each of said capacitors to a common node point
a $\mu$-law/A-law switch having an input terminal and first and second output terminals respectively designated $\mu$-law and A-law terminals,
means for connecting the other plate of said additional capacitor either to a point of reference potential or to the input terminal of said switch,
means for connecting the other plate of the C-valued capacitor of said set to said point of reference potential, to a fixed reference voltage or to a variable fraction of said reference voltage,
means interconnecting said second output terminal to the other plate of said C-valued capacitor of said set when said other plate is connected to either of said specified voltages, whereby said two C-valued capacitors are thereby connected in parallel when said switch completes a circuit path between said input terminal and its A-law output terminal, means for applying to said μ-law output terminal a fixed fraction of the opposite polarity of said reference voltage, means for connecting the other plate of said 128C-valued capacitor either to said point of reference potential or to a variable fraction of said reference voltage, and means for connecting the other plate of each of said other capacitors (those having the relative values 2C, 4C, 8C, 16C, 32C and 64C) to said point of reference potential, to a variable fraction of said reference voltage or to said fixed reference voltage.

6. A combination as in claim 5 wherein the fixed reference voltage constitutes a voltage $V_R$ supplied by a reference voltage source, the polarity of said voltage being determined by a bit applied to said source, said bit constituting the sign bit s of an 8-bit word to be coded.

7. A combination as in claim 6 wherein the variable fraction of said reference voltage constitutes a voltage $(mV_R/16)$ supplied by a step generator voltage source, the value of m being determined by four specified bits wxyz of said 8-bit word to be coded, said bits wxyz being applied to said step generator voltage source.

8. A combination as in claim 7 wherein the fixed fraction of said reference voltage constitutes a voltage $(-V_R/32)$.

9. A combination as in claim 8 wherein the connection pattern established by said connecting means is determined by control signals applied to said connecting means, said control signals being derived from three specified bits abc of said 8-bit word to be coded.

* * * * *